(12) United States Patent
Yamada

(10) Patent No.: US 11,309,320 B2
(45) Date of Patent: Apr. 19, 2022

(54) SEMICONDUCTOR STORAGE DEVICE

(71) Applicant: SOCIONEXT INC., Kanagawa (JP)

(72) Inventor: Tomoyuki Yamada, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 89 days.

(21) Appl. No.: 17/025,191

(22) Filed: Sep. 18, 2020

(65) Prior Publication Data
US 2021/0005618 A1 Jan. 7, 2021

Related U.S. Application Data

(63) Continuation of application No. PCT/JP2019/012473, filed on Mar. 25, 2019.

(30) Foreign Application Priority Data

Apr. 2, 2018 (JP) .............................. JP2018-071030
Aug. 3, 2018 (JP) .............................. JP2018-146865

(51) Int. Cl.
H01L 27/112 (2006.01)
H01L 23/522 (2006.01)
H01L 23/528 (2006.01)

(52) U.S. Cl.
CPC ...... H01L 27/11206 (2013.01); H01L 23/528 (2013.01); H01L 23/5226 (2013.01)

(58) Field of Classification Search
CPC ....... H01L 29/06; H01L 29/78; H01L 29/775; H01L 29/0676; H01L 29/66; H01L 29/0673; H01L 29/42392; H01L 29/786; H01L 29/66787; H01L 29/78696; H01L 45/04; H01L 27/112; H01L 27/11206; H01L 27/24; H01L 27/224; H01L 21/8238; H01L 21/8234; H01L 21/823487; H01L 21/823885; H01L 23/522; H01L 23/528; H01L 23/5226
USPC .......................................................... 257/329
See application file for complete search history.

(56) References Cited

U.S. PATENT DOCUMENTS

| | | | |
|---|---|---|---|
| 7,402,855 B2 | 7/2008 | Kurjanowicz | |
| 2009/0180307 A1 | 7/2009 | Kurjanowicz | |
| 2011/0216572 A1 | 9/2011 | Peng et al. | |
| 2012/0099368 A1* | 4/2012 | Kamata | G11C 11/565 365/149 |
| 2015/0380547 A1 | 12/2015 | Liaw | |

(Continued)

FOREIGN PATENT DOCUMENTS

| | | |
|---|---|---|
| JP | 2009-524899 A | 7/2009 |
| JP | 2010-514168 A | 4/2010 |

OTHER PUBLICATIONS

International Search Report and Written Opinion issued in corresponding International Application No. PCT/JP2019/012473, dated Jun. 11, 2019, with partial English translation.

Primary Examiner — Chuong A Luu
(74) Attorney, Agent, or Firm — McDermott Will & Emery LLP

(57) ABSTRACT

A nonvolatile memory cell using vertical nanowire (VNW) FETs includes a program element of which a gate is connected to a word line, and a switch element that is provided between the program element and a bit line and of which a gate is connected to the word line. The program element and the switch element are each constituted by one or a plurality of VNW FETs, and these VNW FETs are arranged in a line in a first direction.

12 Claims, 16 Drawing Sheets

(56) References Cited

U.S. PATENT DOCUMENTS

2016/0063163 A1 3/2016 Moroz et al.
2016/0268002 A1 9/2016 Chen et al.
2017/0352425 A1* 12/2017 Kasai ................. G11C 16/3431

* cited by examiner

SEMICONDUCTOR STORAGE DEVICE

CROSS-REFERENCE TO RELATED APPLICATIONS

This is a continuation of International Application No. PCT/JP2019/012473 filed on Mar. 25, 2019, which claims priority to Japanese Patent Application No. 2018-071030 filed on Apr. 2, 2018 and No. 2018-146865 filed on Aug. 3, 2018. The entire disclosures of these applications are incorporated by reference herein.

BACKGROUND

The present disclosure relates to a semiconductor memory device provided with vertical nanowire (VNW) field effect transistors (FETs), and more particularly to a layout structure of a nonvolatile memory cell.

For transistors as basic constituents of an LSI, improvement in integration degree, reduction in operating voltage, and improvement in operating speed have been achieved thanks to scaling down of the gate length. Recently, however, an increase in off current due to excessive scaling and the resulting significant increase in power consumption have raised a problem. To solve this problem, three-dimensional transistors having a three-dimensional structure changed from the conventional planar structure have been vigorously studied. As one type of such transistors, a vertical nanowire FET (hereinafter referred to as a VNW FET as appropriate) has attracted attention.

A semiconductor memory device provided with nonvolatile memory cells is used in many applications. As one type of nonvolatile memory cells, there is a one time programmable (OTP) memory cell, which has a feature that a state of "1" or "0" is stored in the memory by breakdown of an insulating film or other means and read therefrom.

U.S. Pat. No. 7,402,855 discloses a configuration of an OTP memory. In this configuration, one transistor has a gate oxide film having two portions different in thickness, and by breaking down the thinner portion of the gate oxide film, a state of "1" or "0" is stored in the memory.

SUMMARY

There is however no prior art document that discloses a configuration of an OTP memory using VNW FETs.

An objective of the present disclosure is providing a small-area layout structure for a nonvolatile memory cell using VNW FETs.

In the first mode of the present disclosure, a semiconductor memory device includes a nonvolatile memory cell, wherein the memory cell includes a program element of which a gate is connected to a word line, and a switch element that is provided between the program element and a bit line and of which a gate is connected to the word line, the program element and the switch element are each constituted by one or a plurality of vertical nanowire (VNW) FETs, and the VNW FETs constituting the program element and the switch element are arranged in a line in a first direction.

According to the above mode, in a nonvolatile memory cell, the program element and the switch element are each constituted by one VNW FET or a plurality of VNW FETs. The VNW FETs constituting the program element and the switch element are arranged in a line in the first direction. This makes the layout structure of the memory cell compact, whereby the area can be kept small.

According to the present disclosure, a small-area layout structure can be implemented for a nonvolatile memory cell using VNW FETs.

BRIEF DESCRIPTION OF THE DRAWINGS

FIG. 1A is a block diagram of a memory cell array and FIG. 1B is a circuit diagram of a memory cell.

FIG. 8A is a block diagram of a memory cell array and FIG. 8B is a circuit diagram of a memory cell.

FIG. 15A is a cross-sectional view and FIG. 15B is a plan view.

DETAILED DESCRIPTION

Embodiments of the present disclosure will be described hereinafter with reference to the accompanying drawings. In the following embodiments, it is assumed that a semiconductor memory device includes nonvolatile memory cells and the memory cells include so-called vertical nanowire FETs (VNW FETs).

Figure 15A:
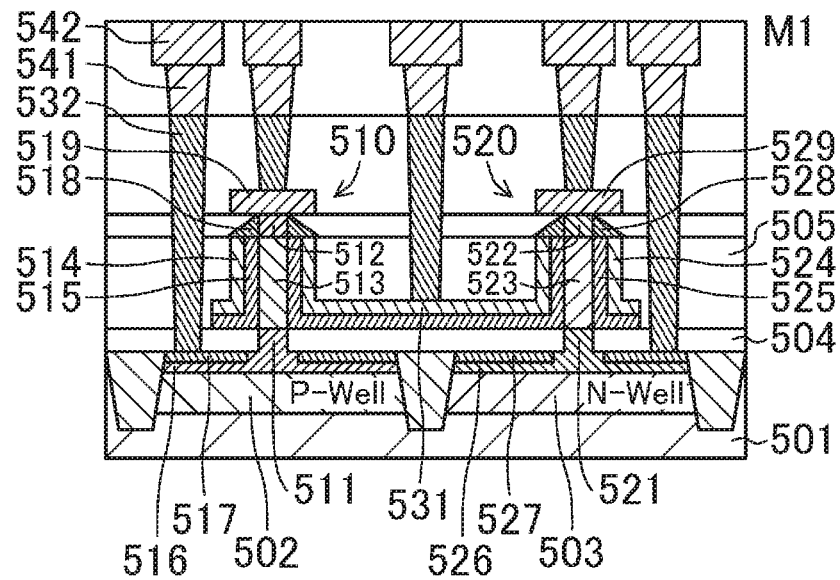
FIGS. 15A and 15B are schematic views showing a basic structure example of vertical nanowire FETs, where
Figure 15B:
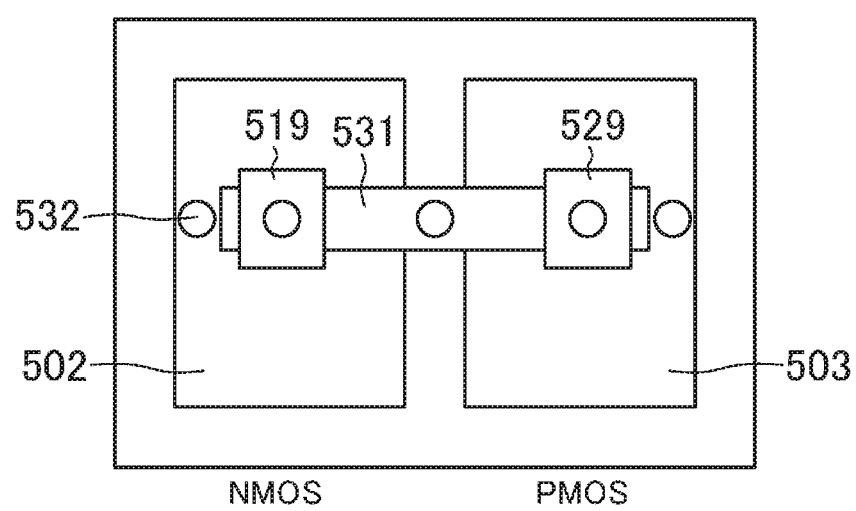

FIGS. 15A and 15B are schematic views showing a basic structure example of VNW FETs, where FIG. 15A is a cross-sectional view and FIG. 15B is a plan view. Note that, in FIG. 15B, illustration of metal interconnects is omitted and, for easy understanding, constituents invisible when actually viewed from top are illustrated.

As shown in FIGS. 15A and 15B, a p-well 502 and an n-well 503 are formed on a semiconductor substrate 501. Note however that no p-well may be formed when the semiconductor substrate 501 is a p-type substrate. A VNW FET 510 that is an n-type transistor is formed on the p-well 502, and a VNW FET 520 that is a p-type transistor is formed on the n-well 503. The reference numeral 504 denotes an insulating film, and 505 denotes an interlayer insulating film.

The VNW FET 510 includes a bottom electrode 511 that is to be a source/drain electrode, a top electrode 512 that is to be a source/drain electrode, and a nanowire 513 formed vertically (perpendicularly to the substrate surface) between the bottom electrode 511 and the top electrode 512. The bottom electrode 511 and the top electrode 512 are doped to have n-type conductivity. At least part of the nanowire 513 is to be a channel region. A gate insulating film 515 is formed around the nanowire 513, and a gate electrode 514 is formed around the gate insulating film 515. The gate electrode 514 may surround the entire of the nanowire 513, or may surround only part of the nanowire 513. When the gate electrode 514 surrounds only part of the nanowire 513, the gate insulating film 515 may be formed on only the portion of the nanowire 513 surrounded by the gate electrode 514.

The bottom electrode 511 is connected with a bottom region 516 formed to spread over the top surface of the semiconductor substrate 501. The bottom region 516 is also doped to have n-type conductivity. A silicide region 517 is formed on the surface of the bottom region 516. A sidewall 518 is formed around the top electrode 512, and a silicide region 519 is formed on the top of the top electrode 512. Note that the sidewall 518 and the silicide region 519 may not be formed.

Likewise, the VNW FET 520 includes a bottom electrode 521 that is to be a source/drain electrode, a top electrode 522 that is to be a source/drain electrode, and a nanowire 523 formed vertically between the bottom electrode 521 and the top electrode 522. The bottom electrode 521 and the top electrode 522 are doped to have p-type conductivity. At least part of the nanowire 523 is to be a channel region. A gate insulating film 525 is formed around the nanowire 523, and a gate electrode 524 is formed around the gate insulating film 525.

The bottom electrode 521 is connected with a bottom region 526 formed to spread over the top surface of the semiconductor substrate 501. The bottom region 526 is also doped to have p-type conductivity. A silicide region 527 is formed on the surface of the bottom region 526. A sidewall 528 is formed around the top electrode 522, and a silicide region 529 is formed on the top of the top electrode 522. Note that the sidewall 528 and the silicide region 529 may not be formed.

In the structure of FIGS. 15A and 15B, the gate electrode region 514 of the VNW FET 510 and the gate electrode region 524 of the VNW FET 520 are mutually connected through a gate interconnect 531. Also, the bottom region 516, the silicide region 519, the gate interconnect 531, the silicide region 529, and the bottom region 526 are individually connected to interconnects 542 formed in a metal interconnect layer M1 via contacts 532 and contacts 541. Another metal interconnect layer may be formed above the metal interconnect layer M1.

The semiconductor substrate 501 is made of any of bulk Si, germanium, and compounds and alloys thereof, for example. Examples of the n-type dopant include As, P, Sb, N, C, and combinations thereof. Examples of the p-type dopant include B, BF2, In, N, C, and combinations thereof. The planar shape of the VNW FETs 510 and 520 (transverse sectional shape of the nanowires 513 and 523) may be a circle, a rectangle, or an ellipse, for example.

Examples of the material of the insulating film 504 include SiN and SiCN. Examples of the material of the interlayer insulating film 505 include SiO, TEOS, PSG, BPSG, FSG, SiOC, SOG, spin-on polymers, SiC, and mixtures thereof. Examples of the material of the silicide regions 517 and 527 include NiSi, CoSi, TiSi, and WSi. Examples of the material of the gate electrodes 514 and 524 and the gate interconnect 531 include TiN, TaN, TiAl, Ti-containing metal, Ta-containing metal, Al-containing metal, W-containing metal, TiSi, NiSi, PtSi, polysilicon with silicide, and mixtures thereof. Examples of the material of the gate insulating films 515 and 525 include SiON, $Si_3N_4$, $Ta_2O_5$, $Al_2O_3$, Hf oxide, Ta oxide, and Al oxide. The k value is preferably 7 or higher.

As the material of the silicide regions 519 and 529 provided on the top electrodes 512 and 522, NiSi, CoSi, MoSi, WSi, PtSi, TiSi, and mixtures thereof may be used. As another configuration, metals such as W, Cu, and Al, alloys such as TiN and TaN, impurity-implanted semiconductors, and mixtures thereof may be used. As the material of the sidewalls 518 and 528, SiN, SiON, SiC, SiCN, and SiOCN, for example, may be used.

As the material of the contacts 532, Ti, TiN, Ta, and TaN, for example, may be used. Cu, Cu alloy, W, Ag, Au, Ni, and Al may also be used. Alternatively, Co and Ru may be used.

Figure 16A:
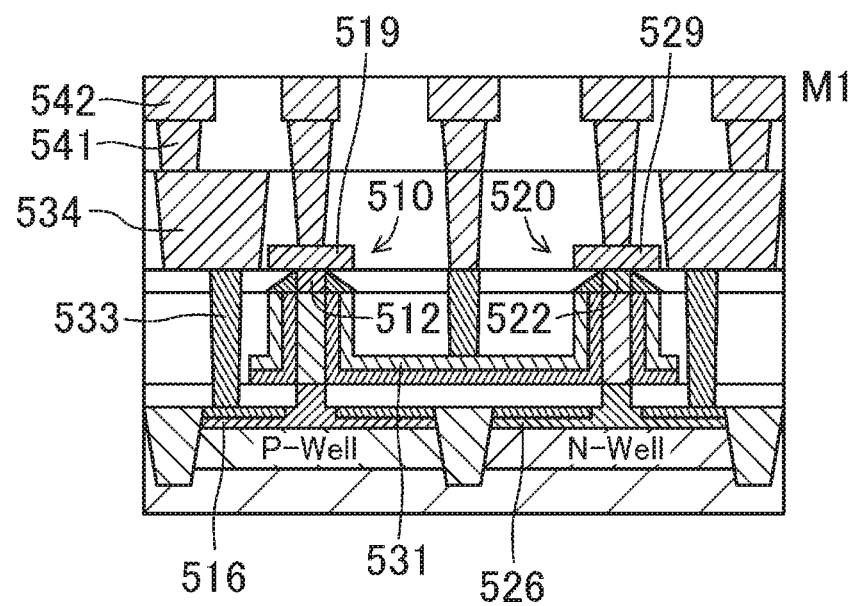
FIGS. 16A and 16B are schematic cross-sectional views showing basic structure examples of vertical nanowire FETs in which local interconnects are used.
Figure 16B:
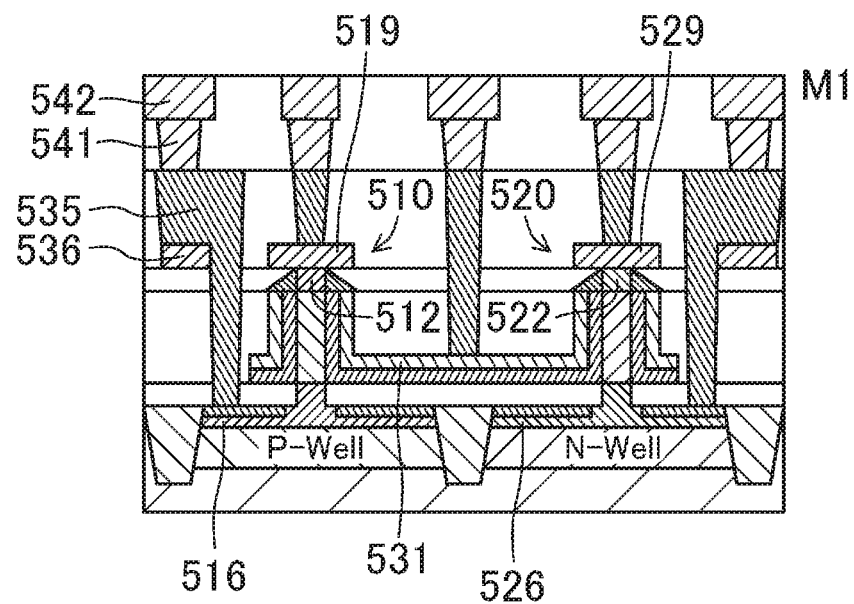

FIGS. 16A and 16B show basic structure examples of VNW FETs in which local interconnects are used. In FIG. 16A, local interconnects 534 are formed between the metal interconnect layer M1 and the top electrodes 512 and 522 of the VNW FETs 510 and 520. The bottom regions 516 and 526 and the gate interconnect 531 are individually connected to the interconnects 542 formed in the metal interconnect layer M1 via contacts 533, local interconnects 534, and the contacts 541. The silicide regions 519 and 529 are individually connected to the interconnects 542 formed in the metal interconnect layer M1 via the local interconnects 534 and the contacts 541.

In FIG. 16B, local interconnects 535 are formed between the metal interconnect layer M1 and the bottom regions 516 and 526. In other words, the local interconnect 535 corresponds to an integrated form of the contact 533 and the local interconnect 534 in FIG. 16A. Silicide regions 536 are used as an etching stopper in the process of forming the local interconnects 535.

In the following description, the bottom electrode, top electrode, and gate electrode of a VNW FET are simply referred to as the bottom, the top, and the gate, respectively, as appropriate. Also, it is assumed that, when one or a plurality of configuration units, each constituted by a vertical nanowire, a top, a bottom, and a gate, constitute one VNW FET, this configuration unit is simply referred to as a "VNW" to distinguish this from the VNW FET. Also, "VDD" refers to a power supply voltage or a high voltage-side power supply line, and "VSS" refers to a power supply voltage or a low voltage-side power supply line.

In the following description, in the plan views such as FIG. 2, the horizontal direction as viewed from the figure is referred to as the X direction (corresponding to the first direction) and the vertical direction as the Y direction (corresponding to the second direction). Also, as used herein, an expression indicating that widths, etc. are the same, like the "same interconnect width" should be understood as including a range of fabrication variations.

First Embodiment

Figure 1A:
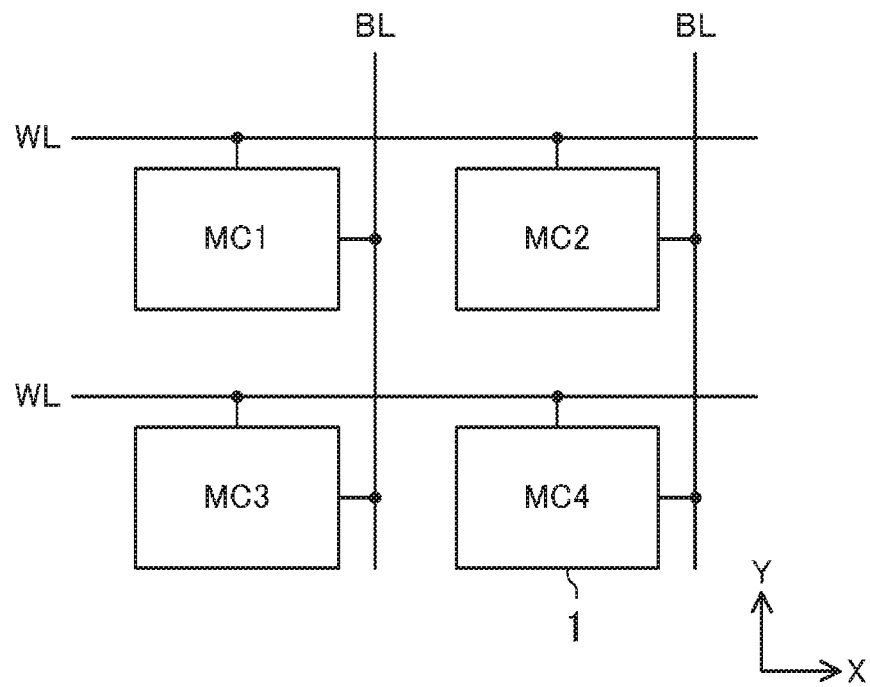
FIGS. 1A and 1B show an configuration example of a semiconductor memory device provided with nonvolatile memory cells according to the first and second embodiments, where
Figure 1B:
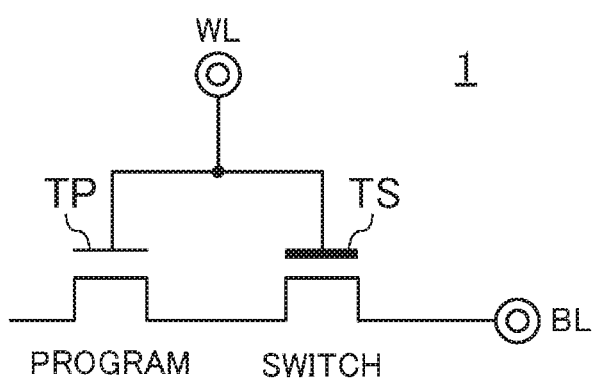

FIGS. 1A and 1B are views showing a configuration example of a semiconductor memory device provided with nonvolatile memory cells according to the first and second embodiments, where FIG. 1A is a block diagram of a memory cell array and FIG. 1B is a circuit diagram of a memory cell. As shown in FIG. 1A, memory cells 1 are connected with their corresponding word lines WL and bit lines BL. Note that, although the semiconductor memory device is provided with, not only the memory cell array, but also peripheral circuits such as a write circuit and a read circuit, illustration of such circuits is omitted here. Note also that, although the memory cell array includes (2×2) memory cells 1 (MC1 to MC4) in FIG. 1A for simplification of the illustration, the numbers of memory cells 1 in the X direction (direction in which the word lines WL extend) and in the Y direction (direction in which the bit lines BL extend) are not limited to these.

In this embodiment, the memory cells 1 are one time programmable (OTP) memory cells of a gate oxide film breakdown type. As shown in FIG. 1B, each memory cell 1 includes serially-connected n-type transistors TP and TS. The transistor TP is a program element, which stores a value "1"/"0" depending on the breakdown/non-breakdown state of the gate oxide film. The transistor TS is a switch element, which controls the access from the bit line BL to the program element.

Since the transistor TP constituting the program element is an object subjected to breakdown of the gate oxide film, the gate oxide film thereof is thinner than that of the transistor TS constituting the switch element. Specifically, for example, the switch element is constituted by a transistor having a gate oxide film thickness of the same level as that of a so-called IO transistor in an input/output circuit for exchanging signals with the outside of the semiconductor integrated circuit. The program element is constituted by a transistor having a gate oxide film thickness of the same level as that of a so-called core transistor in an internal circuit of the semiconductor integrated circuit. The core transistor is lower in the withstand voltage of the gate oxide film than the IO transistor.

The write operation of the memory cell 1 is performed in the following manner A high voltage VPP that is to be a write voltage is applied to a desired word line WL. The high voltage VPP is a voltage higher than the withstand voltage of the gate oxide film of the program element, which is 5 V, for example. Also, 0 V is given to a bit line BL connected to a memory cell 1 in which breakdown of the gate oxide film is intended, and a bit line BL connected to a memory cell 1 in which no breakdown of the gate oxide film is intended is floated. As a result, in the memory cell 1 connected to the bit line BL to which 0 V has been given, the switch element becomes conductive and the gate oxide film of the program element is broken down under the application of the high voltage VPP.

The read operation of the memory cell 1 is performed in the following manner The bit line BL is precharged at 0 V, for example. A voltage VRR lower than the high voltage VPP is applied to a desired word line. The voltage VRR is a voltage causing no breakdown of the gate oxide film of the program element, which is 1 V, for example. At this time, when the gate oxide film of the program element has been broken down, a current flows from the word line WL to the bit line BL through the gate of the program element, causing a rise in the potential of the bit line BL. On the other hand, when the gate oxide film of the program element has not been broken down, the potential of the bit line BL remains unchanged. From this difference in potential, the state of the memory cell 1, i.e., a value "0"/"1" is read.

Figure 2:
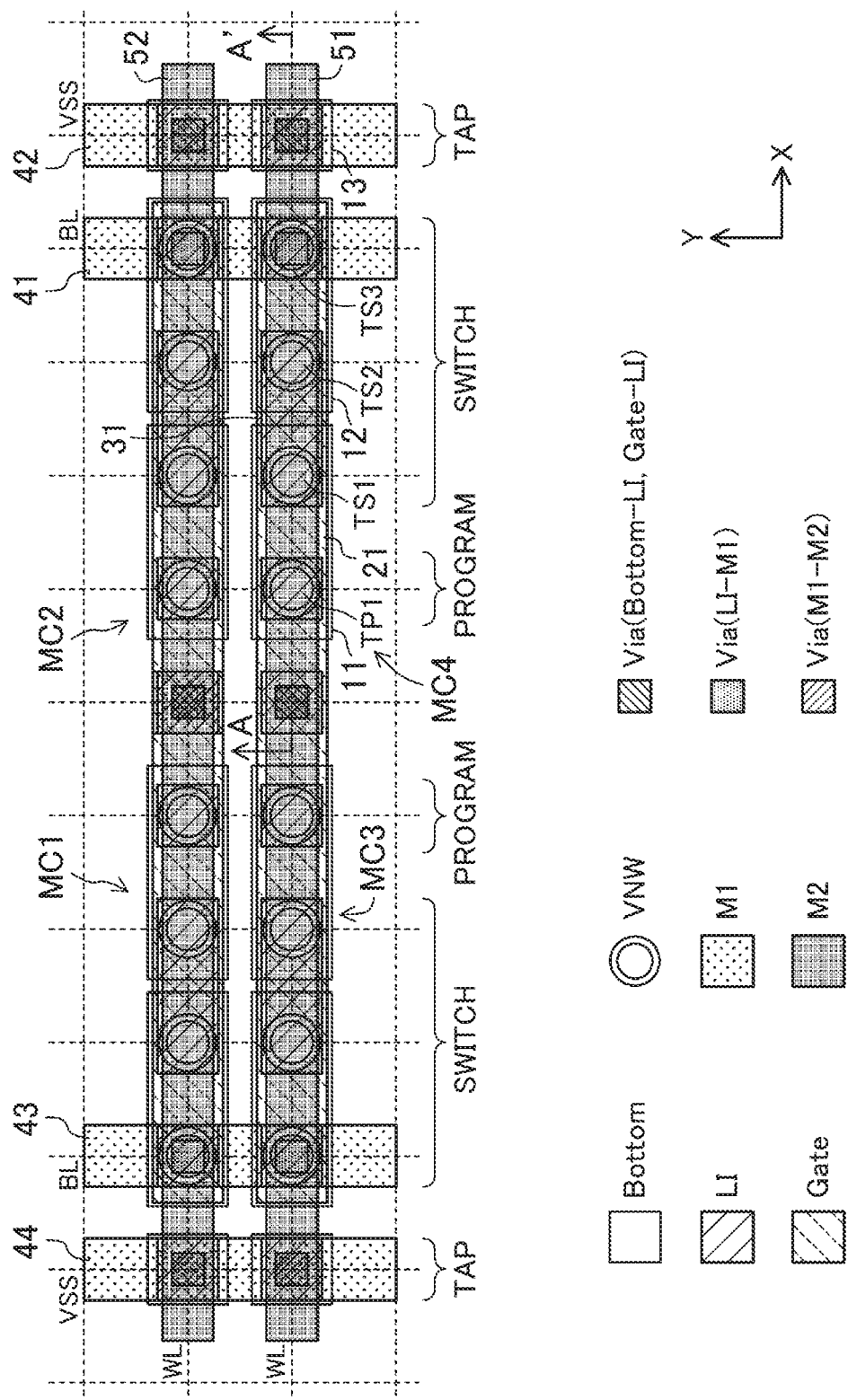
FIG. 2 is a plan view showing a layout structure of a memory cell array according to the first embodiment.
Figure 3:
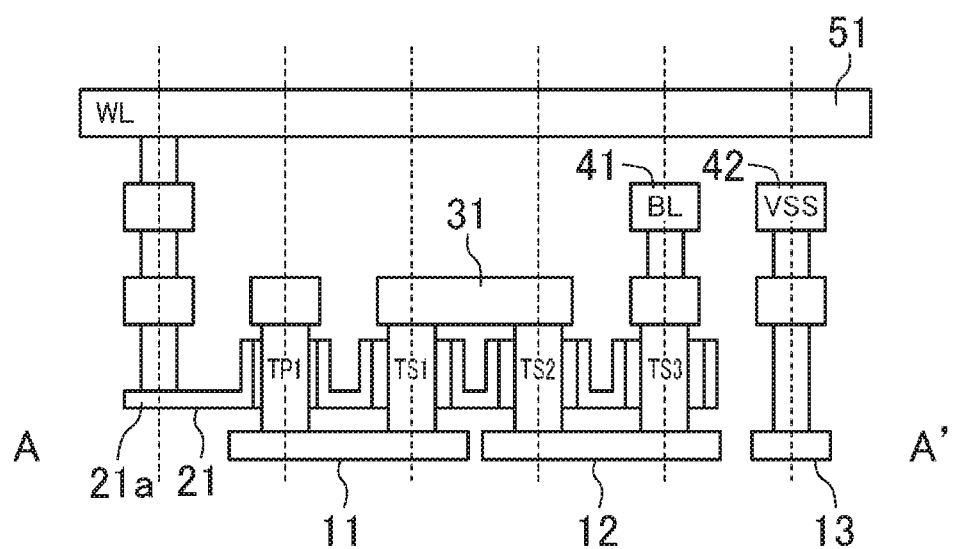
FIG. 3 is a cross-sectional view showing the layout structure of FIG. 2.

FIGS. 2 and 3 are views showing a layout structure example of the memory cell array according to the first embodiment, where FIG. 2 is a plan view and FIG. 3 is a cross-sectional view taken along line A-A' in FIG. 2. The dashed lines running vertically and horizontally in the plan views such as FIG. 2 and the dashed lines running vertically in the cross-sectional views such as FIG. 3 represent grid lines used for placement of components at the time of designing. The grid lines are arranged at equal spacing in the X direction and arranged at equal spacing in the Y direction. The grid spacing may be the same, or different from each other, in the X and Y directions. Also, the grid spacing may be different between layers. For example, grid lines for VNW FETs and grid lines for M1 interconnects may be arranged at different spacing. Further, the components are not necessarily required to lie on grid lines. It is however preferable to place the components on grid lines from the standpoint of preventing or reducing fabrication variations. This also applies to the subsequent embodiments.

The device structure according to this embodiment is based on the structure of FIG. 16A, although it can be a structure based on the structure of FIG. 15 or FIG. 16B, or based on any other device structure. This also applies to the subsequent embodiments. Also, for easy understanding of the figures, illustration of the wells, the STIs, the insulating films, the silicide layers on the bottoms, the silicide layers on the tops, and the sidewalls of the tops is omitted. This also applies to the subsequent drawings.

FIG. 2 shows the layout of the (2×2) memory cells MC1, MC2, MC3, and MC4 constituting a memory cell array. The memory cells MC1 to MC4 have the same structure, although the memory cells MC2 and MC4 have structures inverted horizontally (in the X direction) from the memory cells MC1 and MC3. In each of the memory cells MC1 to MC4, the program element is constituted by one VNW FET and the switch element is constituted by three VNW FETs. The adjacent memory cells MC1 and MC2 share a connecting portion with a word line WL, and the adjacent memory cells MC3 and MC4 share a connecting portion with a word line WL. Tap portions that supply the power supply voltage VSS to a p-well or a p-substrate are provided on the side of the memory cells MC1 and MC3 opposite to the memory cells MC2 and MC4 and also on the side of the memory cells MC2 and MC4 opposite to the memory cells MC1 and MC3.

Details of the layout structure will be described hereinafter taking the memory cell MC4 as an example.

Transistors TP1, TS1, TS2, and TS3 are n-type VNW FETs each having one VNW. The transistor TP1 constitutes the program element, and the transistors TS1, TS2, and TS3 constitute the switch element. The gate oxide films of the transistors TS1, TS2, and TS3 are thicker than the gate oxide film of the transistor TP1. The transistors TP1, TS1, TS2, and TS3 are arranged in a line in the X direction. A p-substrate lies, or a p-well is formed, under the transistors TP1, TS1, TS2, and TS3.

The transistors having different gate oxide film thicknesses can be formed by only masking corresponding gate oxide film regions at the formation of the gate oxide films thereby forming the films separately. This also applies to the subsequent embodiments.

An M2 interconnect 51 that is to be a word line WL is placed to extend in the X direction above the memory cells MC3 and MC4. An M1 interconnect 41 that is to be a bit line BL is placed to extend in the Y direction above the memory cells MC2 and MC4. Also, an M1 interconnect 42 that supplies the power supply voltage VSS is placed to extend in the Y direction above the tap portion lying on the right side of the memory cells MC2 and MC4 as viewed from the figure. Likewise, an M2 interconnect 52 that is to be a word line WL is placed to extend in the X direction above the memory cells MC1 and MC2. An M1 interconnect 43 that is to be a bit line BL is placed to extend in the Y direction above the memory cells MC1 and MC3. Also, an M1 interconnect 44 that supplies the power supply voltage VSS is placed to extend in the Y direction above the tap portion lying on the left side of the memory cells MC1 and MC3 as viewed from the figure.

Bottom regions 11, 12, and 13 are formed. The bottoms of the transistors TP1 and TS1 are connected to the bottom region 11, the bottoms of the transistors TS2 and TS3 are connected to the bottom region 12, and the bottom region 13 is formed in the corresponding tap portion. The bottom region 13 is connected to the M1 interconnect 42 that supplies the power supply voltage VSS, through vias and a local interconnect.

A gate interconnect 21, extending in the X direction, is connected with the gates of the transistors TP1, TS1, TS2, and TS3. The gate interconnect 21 has an interconnect portion 21a extending from the side of the transistor TP1 opposite to the transistor TS1. The interconnect portion 21a is connected with the M2 interconnect 51 that is to be a word line WL through vias, a local interconnect, and an M1 interconnect. The interconnect portion 21a is shared by the adjacent memory cells MC3 and MC4.

The tops of the transistors TS1 and TS2 are connected to a local interconnect 31 extending in the X direction. The top of the transistor TS3 is connected with the M1 interconnect 41 that is to be a bit line BL through a local interconnect and a via. That is, the transistors TS1, TS2, and TS3 are serially connected between the bottom region 11 to which the bottom of the transistor TP1 is connected and the M1 interconnect 41 that is to be a bit line BL through the local interconnect 31 and the bottom region 12.

The layout structure described above has features as follows, for example.

The VNW FETs TP1, TS1, TS2, and TS3 constituting the program element and the switch element are arranged in a line in the X direction. This makes the layout structure of the memory cell compact, whereby the area can be kept small. Also, the gate interconnect 21 extending in the X direction is connected with the gates of the VNW FETs TP1, TS1, TS2, and TS3. This makes the layout structure of the memory cell more compact. Further, the M2 interconnect 51 that is to be a word line WL extends in the X direction, and the VNW FETs TP1, TS1, TS2, and TS3 overlap the gate interconnect 21 and the M2 interconnect 51 as viewed from top. This makes the layout structure of the memory cell more compact.

In the serially connected transistors TS1, TS2, and TS3 constituting the switch element, the top of the transistor TS3 is connected with the M1 interconnect 41 that is to be a bit line BL. This makes the configuration for connection between the switch element and the bit line BL simple, whereby reduction in the area of the memory cell can be realized.

In the serially connected transistors TS1, TS2, and TS3 constituting the switch element, the tops of the transistors TS1 and TS2 are mutually connected through the local interconnect 31, and the bottoms of the transistors TS2 and TS3 are mutually connected through the bottom region 12. In this way, by alternately connecting the tops and bottoms of the VNW FETs constituting the switch element, the configuration for serial connection of the VNW FETs becomes simple. Reduction in the area of the memory cell can therefore be realized.

The interconnect portion 21a for connecting the gate interconnect 21 with the word line WL is provided at an end of the memory cell. This makes it possible to share the interconnect portion 21a with its adjacent memory cell, whereby reduction in the area of the memory cell can be realized.

In the M1 interconnect layer, M1 interconnects extending in the Y direction may be provided in the unoccupied portion between the interconnect portion 21a and the M1 interconnect 41. This will make the pattern of the M1 interconnects uniform. Also, by providing power supply interconnects as the M1 interconnects, strengthening of power supply will be possible.

The bottom regions extend in the X direction, and have the same region width and a fixed placement pitch. The gate interconnects extend in the X direction, and have the same interconnect width and a fixed interconnect pitch. The local interconnects extend in the X direction, and have the same interconnect width and a fixed interconnect pitch. The M1 interconnects extend in the Y direction, and have the same interconnect width and a fixed interconnect pitch. The M2 interconnects extend in the X direction, and have the same interconnect width and a fixed interconnect pitch.

Accordingly, the fabrication precision of the semiconductor memory device improves, and variations in device characteristics are prevented or reduced. Note that all the regions or interconnects in each layer do not have to be the same in direction, width, or interconnect pitch.

Second Embodiment

Figure 4:
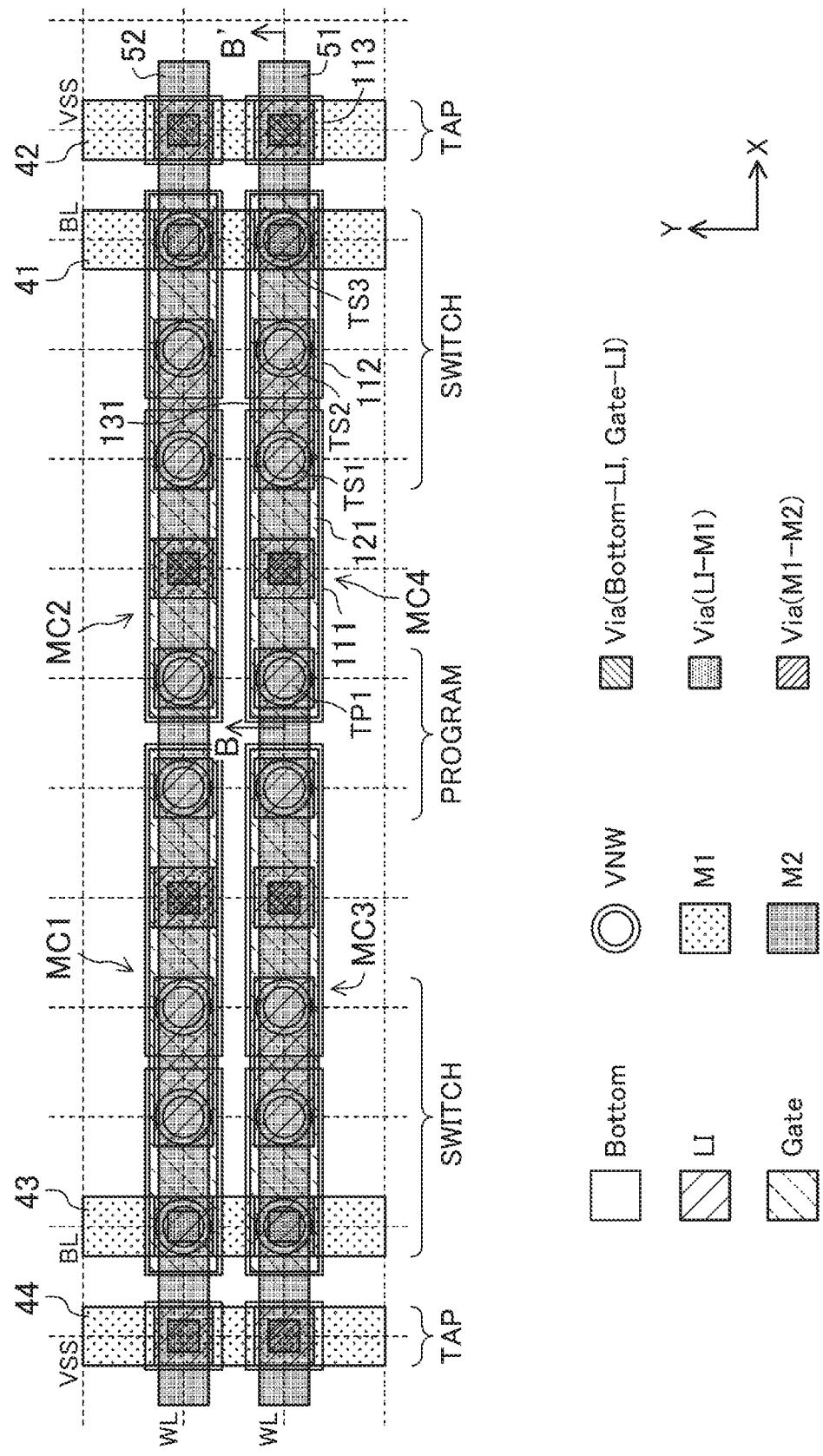
FIG. 4 is a plan view showing a layout structure of a memory cell array according to the second embodiment.
Figure 5:
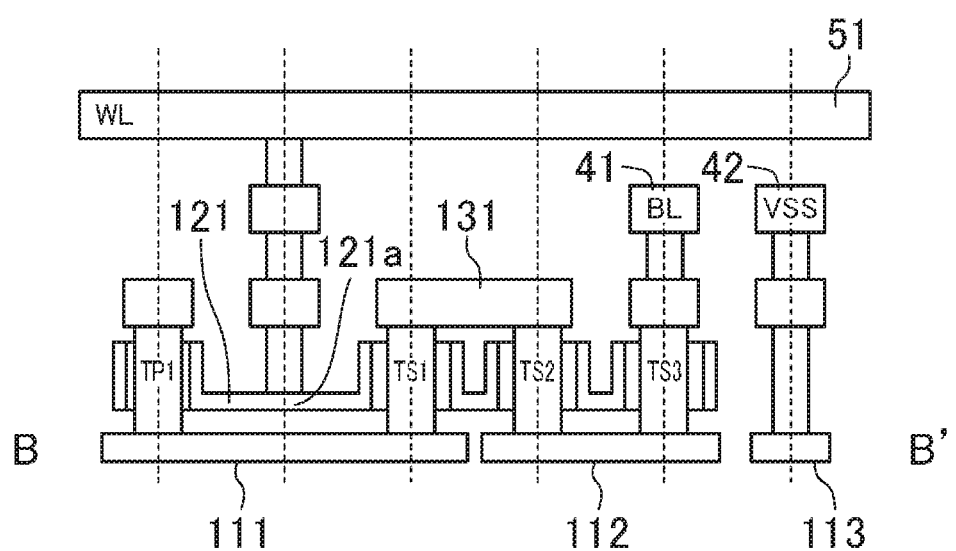
FIG. 5 is a cross-sectional view showing the layout structure of FIG. 4.

FIGS. 4 and 5 are views showing a layout structure example of a memory cell array according to the second embodiment, where FIG. 4 is a plan view and FIG. 5 is a cross-sectional view taken along line B-B' in FIG. 4. Memory cells MC1 to MC4 have the same structure, although the memory cells MC2 and MC4 have structures inverted horizontally (in the X direction) from the memory cells MC1 and MC3. In each of the memory cells MC1 to MC4, the program element is constituted by one VNW FET and the switch element is constituted by three VNW FETs. Tap portions that supply the power supply voltage VSS to a p-well or a p-substrate are provided on the side of the memory cells MC1 and MC3 opposite to the memory cells MC2 and MC4 and also on the side of the memory cells MC2 and MC4 opposite to the memory cells MC1 and MC3.

Details of the layout structure will be described hereinafter taking the memory cell MC4 as an example.

Transistors TP1, TS1, TS2, and TS3 are n-type VNW FETs each having one VNW. The transistor TP1 constitutes the program element, and the transistors TS1, TS2, and TS3 constitute the switch element. The gate oxide films of the transistors TS1, TS2, and TS3 are thicker than the gate oxide film of the transistor TP1. The transistors TP1, TS1, TS2, and TS3 are arranged in a line in the X direction. The transistor TP1 is however spaced from the other transistors TS1, TS2, and TS3 by a distance corresponding to one grid cell. A p-substrate lies, or a p-well is formed, under the transistors TP1, TS1, TS2, and TS3.

An M2 interconnect 51 that is to be a word line WL is placed to extend in the X direction above the memory cells MC3 and MC4. An M1 interconnect 41 that is to be a bit line BL is placed to extend in the Y direction above the memory cells MC2 and MC4. Also, an M1 interconnect 42 that supplies the power supply voltage VSS is placed to extend in the Y direction above the tap portion lying on the right side of the memory cells MC2 and MC4 as viewed from the figure. Likewise, an M2 interconnect 52 that is to be a word line WL is placed to extend in the X direction above the memory cells MC1 and MC2. An M1 interconnect 43 that is to be a bit line BL is placed to extend in the Y direction above the memory cells MC1 and MC3. Also, an M1 interconnect 44 that supplies the power supply voltage VSS is placed to extend in the Y direction above the tap portion lying on the left side of the memory cells MC1 and MC3 as viewed from the figure.

Bottom regions 111, 112, and 113 are formed. The bottoms of the transistors TP1 and TS1 are connected to the bottom region 111, the bottoms of the transistors TS2 and TS3 are connected to the bottom region 112, and the bottom region 113 is formed in the corresponding tap portion. The bottom region 113 is connected to the M1 interconnect 42 that supplies the power supply voltage VSS, through vias and a local interconnect.

A gate interconnect 121, extending in the X direction, is connected with the gates of the transistors TP1, TS1, TS2, and TS3. The gate interconnect 121 has an interconnect portion 121a between the transistor TP1 and the transistor TS1. The interconnect portion 121a is connected with the M2 interconnect 51 that is to be a word line WL through vias, a local interconnect, and an M1 interconnect.

The tops of the transistors TS1 and TS2 are connected to a local interconnect 131 extending in the X direction. The top of the transistor TS3 is connected with the M1 interconnect 41 that is to be a bit line BL through a local interconnect and a via. That is, the transistors TS1, TS2, and TS3 are serially connected between the bottom region 111 to which the bottom of the transistor TP1 is connected and the M1 interconnect 41 that is to be a bit line BL through the local interconnect 131 and the bottom region 112.

The layout structure described above has features as follows, for example.

The VNW FETs TP1, TS1, TS2, and TS3 constituting the program element and the switch element are arranged in a line in the X direction. This makes the layout structure of the memory cell compact, whereby the area can be kept small. Also, the gate interconnect 121 extending in the X direction is connected with the gates of the VNW FETs TP1, TS1, TS2, and TS3. This makes the layout structure of the memory cell more compact. Further, the M2 interconnect 51 that is to be a word line WL extends in the X direction, and the VNW FETs TP1, TS1, TS2, and TS3 overlap the gate interconnect 121 and the M2 interconnect 51 as viewed from top. This makes the layout structure of the memory cell more compact.

In the serially connected transistors TS1, TS2, and TS3 constituting the switch element, the top of the transistor TS3 is connected with the M1 interconnect 41 that is to be a bit line BL. This makes the configuration for connection between the switch element and the bit line BL simple, whereby reduction in the area of the memory cell can be realized.

In the serially connected transistors TS1, TS2, and TS3 constituting the switch element, the tops of the transistors TS1 and TS2 are mutually connected through the local interconnect 131, and the bottoms of the transistors TS2 and TS3 are mutually connected through the bottom region 112. In this way, by alternately connecting the tops and bottoms of the VNW FETs constituting the switch element, the configuration for serial connection of the VNW FETs becomes simple, whereby reduction in the area of the memory cell can be realized.

The transistor TP1 constituting the program element and the transistors TS1, TS2, and TS3 constituting the switch element are placed apart from each other. Also, the transistor TP1 is adjacent to the transistor constituting the program element of each of the memory cells MC2 and MC3. The transistors constituting the program elements and the transistors constituting the switch elements are formed separately since they are different in the thickness of the gate oxide film. Therefore, by placing the transistors constituting the program elements and the transistors constituting the switch elements apart from each other, as in this embodiment, obtained are advantages that the fabrication precision enhances, the reliability of the semiconductor memory device improves, and the yield improves.

In the M1 interconnect layer, M1 interconnects extending in the Y direction may be provided in the unoccupied portion between the interconnect portion 121a and the M1 interconnect 41 or between the adjacent interconnect portions 121a. This will make the pattern of the M1 interconnects uniform. Also, by providing power supply interconnects as the M1 interconnects, strengthening of power supply will be possible.

The bottom regions extend in the X direction, and have the same region width and a fixed placement pitch. The gate interconnects extend in the X direction, and have the same interconnect width and a fixed interconnect pitch. The local interconnects extend in the X direction, and have the same interconnect width and a fixed interconnect pitch. The M1 interconnects extend in the Y direction, and have the same interconnect width and a fixed interconnect pitch. The M2 interconnects extend in the X direction, and have the same interconnect width and a fixed interconnect pitch.

Accordingly, the fabrication precision of the semiconductor memory device improves, and variations in device characteristics are prevented or reduced. Note that all the regions or interconnects in each layer do not have to be the same in direction, width, or interconnect pitch.

(Alteration 1)

While the switch element is constituted by three stages of serially connected transistors in the layout structure according to the first and second embodiments described above, the number of stages of connected transistors constituting the switch element is not limited to three.

Figure 6A:
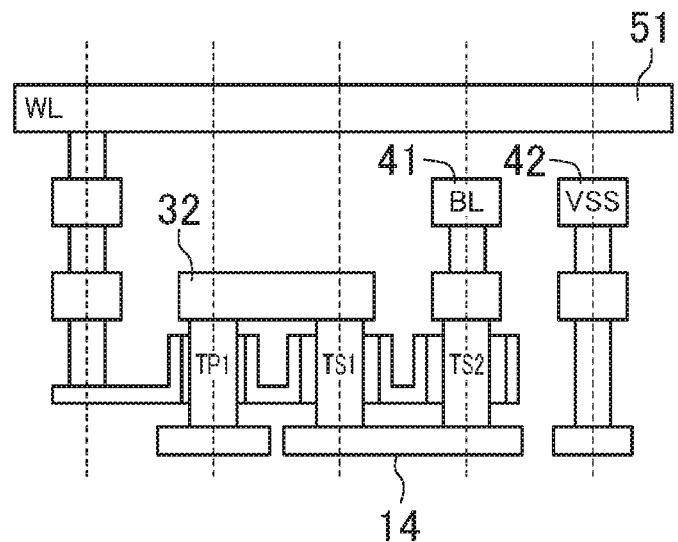
FIGS. 6A and 6B are cross-sectional views showing layout structures of memory cells according to an alteration of the first and second embodiments.
Figure 6B:
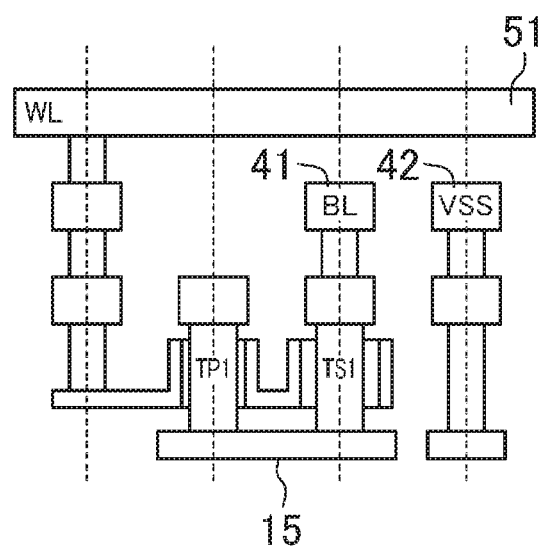

FIGS. 6A and 6B are cross-sectional views showing configurations of memory cells according to Alteration 1. In FIG. 6A, the switch element is constituted by two stages of serially connected transistors TS1 and TS2. The tops of the transistors TP1 and TS1 are connected through a local interconnect 32, and the bottoms of the transistors TS1 and TS2 are connected to a bottom region 14. That is, the transistors TS1 and TS2 constituting the switch element are serially connected between the local interconnect 32 to which the top of the transistor TP1 constituting the program element is connected and the M1 interconnect 41 that is to be a bit line BL through the bottom region 14.

In FIG. 6B, the switch element is constituted by one stage of transistor TS1. The transistors TP1 and TS1 are connected to a bottom region 15. That is, the transistor TS1 constituting the switch element is connected between the bottom region 15 to which the bottom of the transistor TP1 constituting the program element is connected and the M1 interconnect 41 that is to be a bit line BL.

In the write operation of the memory cell, when the gate oxide film of the program element has been broken down under application of the high voltage VPP, the switch element is exposed to the high voltage VPP at both ends. For this reason, the source-drain of the switch element needs to withstand the high voltage VPP. By constituting the switch element by a plurality of stages, e.g. three stages, of serially connected VNW FETs, the switch element can be easily made to withstand the high voltage VPP. Note that, if the source-drain of one VNW FET can withstand the high voltage VPP, it is acceptable to constitute the switch element by one stage of transistor as shown in FIG. 6B.

While the alteration examples in FIGS. 6A and 6B are based on the layout structure according to the first embodiment, it is also possible to change the number of stages of connected transistors constituting the switch element for the layout structure according to the second embodiment, as in FIGS. 6A and 6B.

(Alteration 2)

In the layout structures according to the first and second embodiments described above, it is possible to invert the placement positions of the program element and the switch element in the X direction.

Figure 7A:
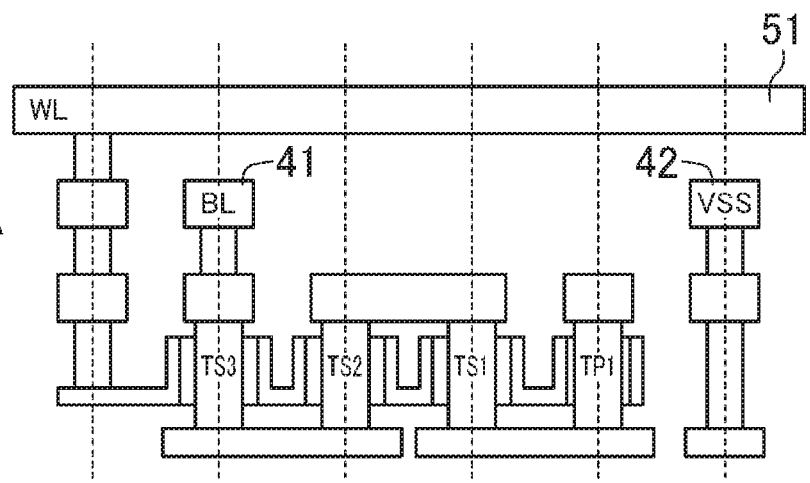
FIGS. 7A and 7B are cross-sectional views showing layout structures of memory cells according to an alteration of the first and second embodiments.
Figure 7B:
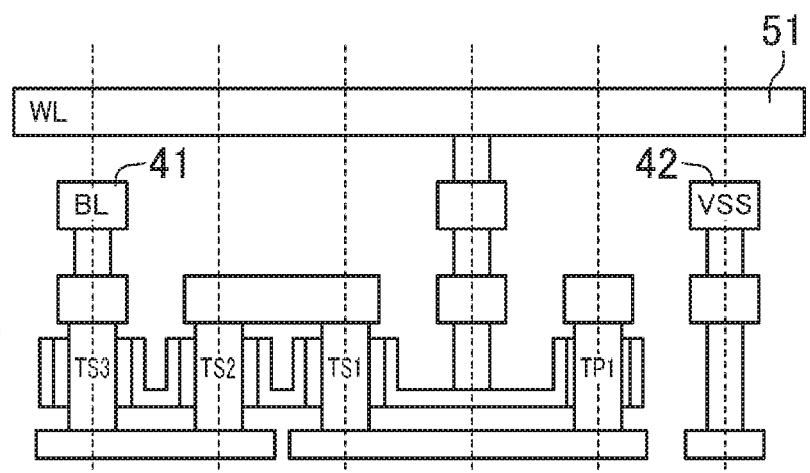

FIGS. 7A and 7B are cross-sectional views showing configurations of memory cells according to Alteration 2. In FIG. 7A, in the memory cell according to the first embodiment, the positions of the transistor TP1 constituting the program element and the transistors TS1, TS2, and TS3 constituting the switch element are inverted in the X direction. In FIG. 7B, in the memory cell according to the second embodiment, the positions of the transistor TP1 constituting the program element and the transistors TS1, TS2, and TS3 constituting the switch element are inverted in the X direction. Note that the configuration of FIG. 7B is the same as that of the memory cells MC1 and MC3 in the second embodiment, except for the tap portion.

Third Embodiment

Figure 8A:
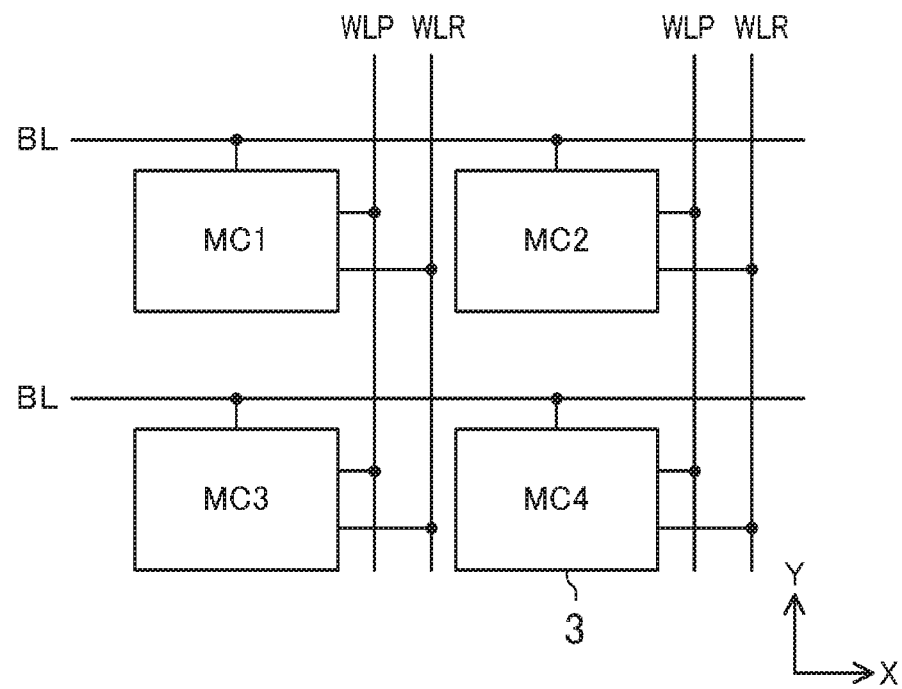
FIGS. 8A and 8B show an configuration example of a semiconductor memory device provided with nonvolatile memory cells according to the third embodiment, where
Figure 8B:
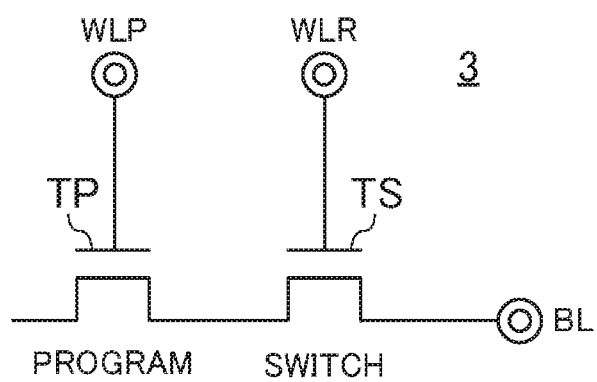

FIGS. 8A and 8B are views showing a configuration example of a semiconductor memory device provided with nonvolatile memory cells according to the third embodiment, where FIG. 8A is a block diagram of a memory cell array and FIG. 8B is a circuit diagram of a memory cell. As shown in FIG. 8A, memory cells 3 are connected with their corresponding first word lines WLP, second word lines WLR, and bit lines BL. Note that, although the semiconductor memory device is provided with, not only the memory cell array, but also peripheral circuits such as a write circuit and a read circuit, illustration of such circuits is omitted here. Note also that, although the memory cell array includes (2×2) memory cells 3 (MC1 to MC4) in FIG. 8A for simplification of the illustration, the numbers of memory cells 3 in the X direction (direction in which the bit lines BL extend in this embodiment) and in the Y direction (direction in which the first and second word lines WLP and WLR extend in this embodiment) are not limited to these.

In this embodiment, also, the memory cells 3 are one time programmable (OTP) memory cells of a gate oxide film breakdown type. As shown in FIG. 8B, each memory cell 3 includes serially-connected n-type transistors TP and TS. The transistor TP is a program element, of which the gate is connected to the first word line WLP. The program element stores a value "1"/"0" depending on the breakdown/non-breakdown state of the gate oxide film. The transistor TS is a switch element, of which the gate is connected to the second word line WLR. The switch element controls the access from the bit line BL to the program element. In this embodiment, the switch element and the program element are each constituted by a transistor having a gate oxide film thickness of the same level as that of a so-called core transistor in an internal circuit of a semiconductor integrated circuit, for example.

The write operation of the memory cell 3 is performed in the following manner A high voltage VPP that is to be a write voltage is applied to a desired first word line WLP. The high voltage VPP is a voltage higher than the withstand voltage of the gate oxide film of the program element, which is 3 V, for example. A voltage VPR is applied to the second word line WLR. The voltage VPR is a voltage that is lower than the withstand voltage of the gate oxide film of the switch element and also makes the voltage (VPP-VPR) lower than the withstand voltage of the gate oxide film of the switch element, which is 1 V, for example. Also, 0 V is given to a bit line BL connected to a memory cell 3 in which breakdown of the gate oxide film is intended, and the voltage VPR is applied to a bit line BL connected to a memory cell 3 in which no breakdown of the gate oxide film is intended. As a result, in the memory cell 3 connected to the bit line BL to which 0 V has been given, the switch element becomes conductive and the gate oxide film of the program element is broken down under the application of the high voltage VPP.

The read operation of the memory cell 3 is performed in the following manner. The bit line BL is precharged at 0 V, for example. A voltage VRR lower than the high voltage VPP is applied to desired first and second word lines WLP and WLR. The voltage VRR is a voltage causing no breakdown of the gate oxide film of the program element, which is 1 V, for example. At this time, when the gate oxide film of the program element has been broken down, a current flows from the first word line WLP to the bit line BL through the gate of the program element, causing a rise in the potential of the bit line BL. On the other hand, when the gate oxide film of the program element has not been broken down, the potential of the bit line BL remains unchanged. From this difference in potential, the state of the memory cell 3, i.e., a value "0"/"1" is read.

Figure 9:
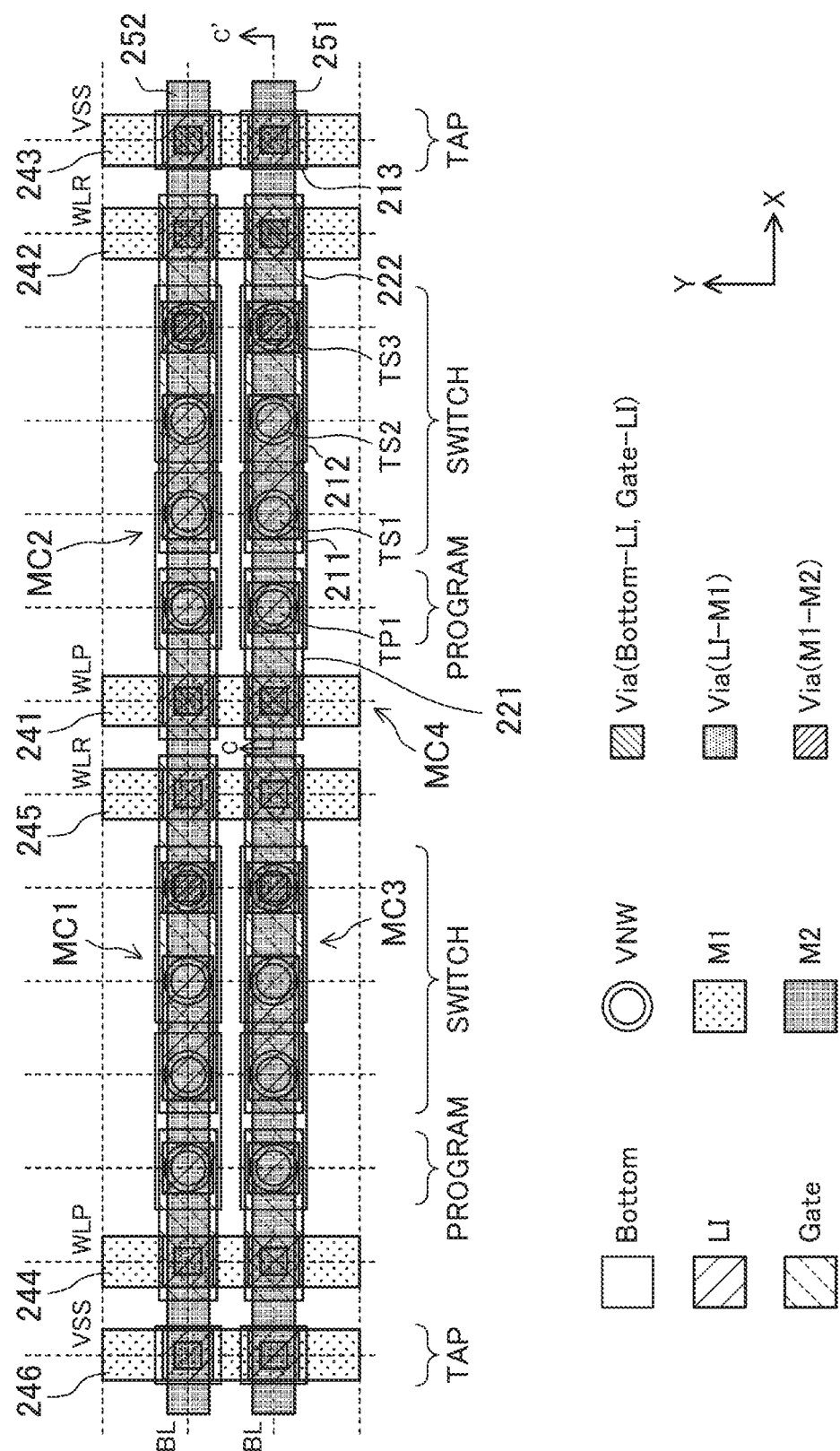
FIG. 9 is a plan view showing a layout structure of a memory cell array according to the third embodiment.
Figure 10:
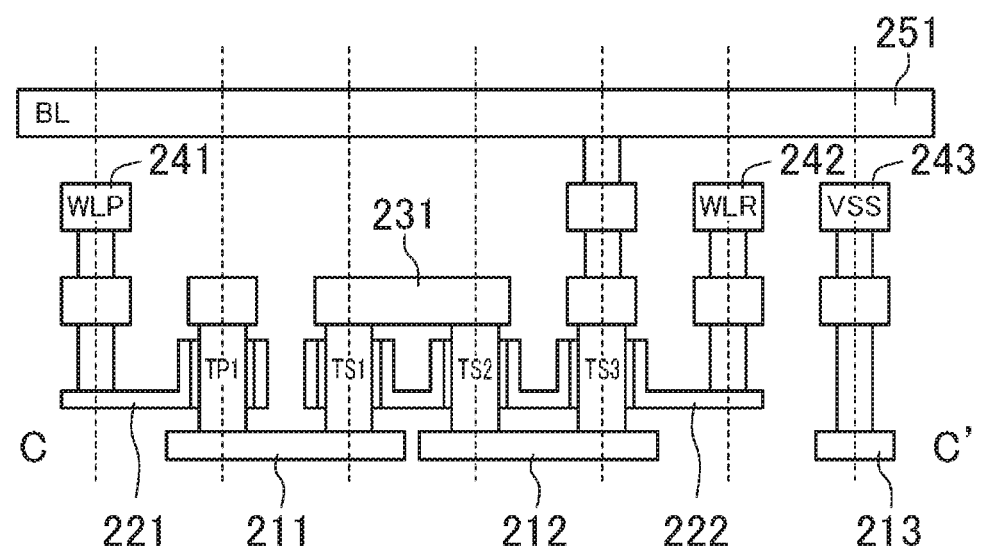
FIG. 10 is a cross-sectional view showing the layout structure of FIG. 9.

FIGS. 9 and 10 are views showing a layout structure example of the memory cell array according to the third embodiment, where FIG. 9 is a plan view and FIG. 10 is a cross-sectional view taken along line C-C' in FIG. 9. FIG. 9 shows the layout of the (2×2) memory cells MC1, MC2, MC3, and MC4 constituting the memory cell array. The memory cells MC1 to MC4 have the same structure. In each of the memory cells MC1 to MC4, the program element is constituted by one VNW FET and the switch element is constituted by three VNW FETs. Tap portions that supply the power supply voltage VSS to a p-well or a p-substrate are provided on the side of the memory cells MC1 and MC3 opposite to the memory cells MC2 and MC4 and also on the side of the memory cells MC2 and MC4 opposite to the memory cells MC1 and MC3.

Details of the layout structure will be described hereinafter taking the memory cell MC4 as an example.

Transistors TP1, TS1, TS2, and TS3 are n-type VNW FETs each having one VNW. The transistor TP1 constitutes the program element, and the transistors TS1, TS2, and TS3 constitute the switch element. In this embodiment, the gate oxide films of the transistors TP1, TS1, TS2, and TS3 have the same thickness. The transistors TP1, TS1, TS2, and TS3 are arranged in a line in the X direction. A p-substrate lies, or a p-well is formed, under the transistors TP1, TS1, TS2, and TS3.

An M2 interconnect 251 that is to be a bit line BL is placed to extend in the X direction above the memory cells MC3 and MC4. An M1 interconnect 241 that is to be a first word line WLP and an M1 interconnect 242 that is to be a second word line WLR are placed to extend in the Y direction above the memory cells MC2 and MC4. The M1 interconnects 241 and 242 are placed on both sides of the row of the transistors TP1, TS1, TS2, and TS3 constituting the program element and the switch element in the X direction and do not overlap any of the transistors TP1, TS1, TS2, and TS3 as viewed from top. Also, an M1 interconnect 243 that supplies the power supply voltage VSS is placed to extend in the Y direction above the tap portion lying on the right side of the memory cells MC2 and MC4 as viewed from the figure. Likewise, an M2 interconnect 252 that is to be a bit line BL is placed to extend in the X direction above the memory cells MC1 and MC2. An M1 interconnect 244 that is to be a first word line WLP and an M1 interconnect 245 that is to be a second word line WLR are placed to extend in the Y direction above the memory cells MC1 and MC3. Also, an M1 interconnect 246 that supplies the power supply voltage VSS is placed to extend in the Y direction above the tap portion lying on the left side of the memory cells MC1 and MC3 as viewed from the figure.

Bottom regions 211, 212, and 213 are formed. The bottoms of the transistors TP1 and TS1 are connected to the bottom region 211, the bottoms of the transistors TS2 and TS3 are connected to the bottom region 212, and the bottom region 213 is formed in the corresponding tap portion. The bottom region 213 is connected to the M1 interconnect 243 that supplies the power supply voltage VSS, through vias and a local interconnect.

A gate interconnect 221, connected with the gate of the transistor TP1, is drawn out from the side of the transistor TP1 opposite to the transistor TS1. The gate interconnect 221 is connected with the M1 interconnect 241 that is to be a first word line WLP through vias and a local interconnect. A gate interconnect 222, connected with the gates of the transistors TS1, TS2, and TS3, is drawn out from the side of the transistor TS3 opposite to the transistor TS2. The gate interconnect 222 is connected with the M1 interconnect 242 that is to be a second word line WLR through vias and a local interconnect.

The tops of the transistors TS1 and TS2 are connected to a local interconnect 231 extending in the X direction. The top of the transistor TS3 is connected with the M2 interconnect 251 that is to be a bit line BL through a local interconnect and vias. That is, the transistors TS1, TS2, and TS3 are serially connected between the bottom region 211 to which the bottom of the transistor TP1 is connected and the M2 interconnect 251 that is to be a bit line BL through the local interconnect 231 and the bottom region 212.

The layout structure described above has features as follows, for example.

The VNW FETs TP1, TS1, TS2, and TS3 constituting the program element and the switch element are arranged in a line in the X direction. This makes the layout structure of the memory cell compact, whereby the area can be kept small. Also, the M2 interconnect 251 that is to be a bit line BL extends in the X direction, and the VNW FETs TP1, TS1, TS2, and TS3 overlap the M2 interconnect 251 as viewed from top. This makes the layout structure of the memory cell more compact. Further, the M1 interconnects 241 and 242 that are to be first and second word lines WLP and WLR extend in the Y direction, i.e., in the direction perpendicular to the row of the VNW FETs TP1, TS1, TS2, and TS3 constituting the program element and the switch element. This can prevent or reduce increase in area caused by the first and second word lines WLP and WLR.

In the serially connected transistors TS1, TS2, and TS3 constituting the switch element, the top of the transistor TS3 is connected with the M2 interconnect 251 that is to be a bit line BL. This makes the configuration for the connection between the switch element and the bit line BL simple, whereby reduction in the area of the memory cell can be realized.

In the serially connected transistors TS1, TS2, and TS3 constituting the switch element, the tops of the transistors TS1 and TS2 are mutually connected through the local interconnect 231, and the bottoms of the transistors TS2 and TS3 are mutually connected through the bottom region 212. In this way, by alternately connecting the tops and bottoms of the VNW FETs constituting the switch element, the configuration for the serial connection of the VNW FETs becomes simple. Reduction in the area of the memory cell can therefore be realized.

In the M1 interconnect layer, M1 interconnects extending in the Y direction may be provided in the unoccupied portion between the M1 interconnect 241 and the VNW FET TS3. This will make the pattern of the M1 interconnects uniform. Also, by providing power supply interconnects as the M1 interconnects, strengthening of power supply will be possible.

The bottom regions extend in the X direction, and have the same region width and a fixed placement pitch. The gate interconnects extend in the X direction, and have the same interconnect width and a fixed interconnect pitch. The local interconnects extend in the X direction, and have the same interconnect width and a fixed interconnect pitch. The M1 interconnects extend in the Y direction, and have the same interconnect width and a fixed interconnect pitch. The M2 interconnects extend in the X direction, and have the same interconnect width and a fixed interconnect pitch.

Accordingly, the fabrication precision of the semiconductor memory device improves, and variations in device characteristics are prevented or reduced. Note that all the regions or interconnects in each layer do not have to be the same in direction, width, or interconnect pitch.

While the gate oxide films of the program element and the switch element were assumed to have the same thickness, they may have different thicknesses from each other. Note however that, having the same gate oxide film thickness throughout the program element and the switch element, it is unnecessary to form the gate oxide films separately, making the fabrication of the semiconductor memory device easy.

(Alteration 3)

While the switch element is constituted by three stages of serially connected transistors in the layout structure according to the third embodiment described above, the number of stages of connected transistors constituting the switch element is not limited to three, as exemplified in Alteration 1 of the first and second embodiments.

Figure 11A:
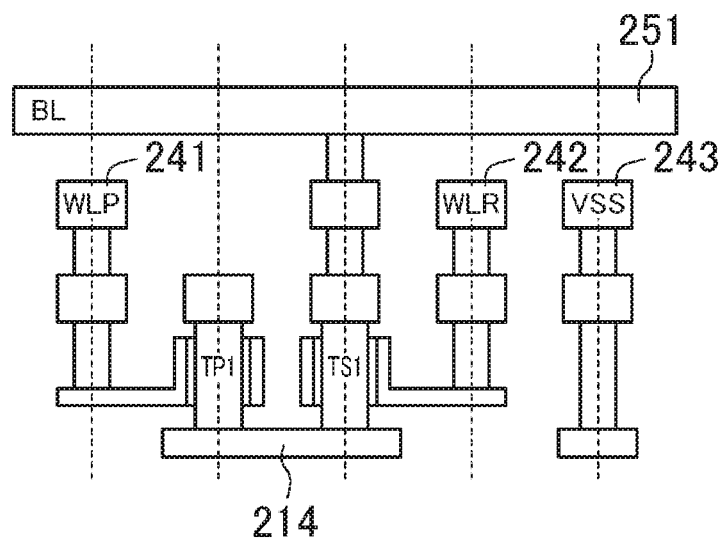
FIGS. 11A and 11B are cross-sectional views showing layout structures of memory cells according to an alteration of the third embodiment.
Figure 11B:
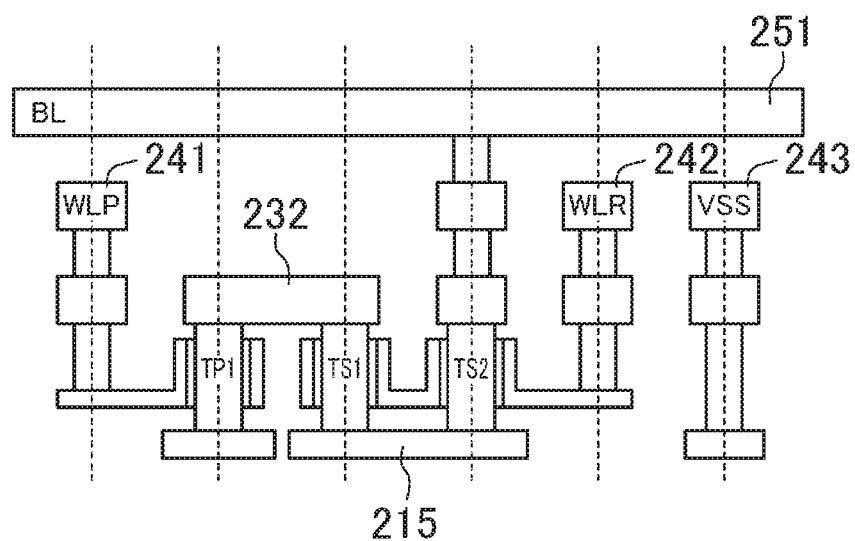

FIGS. 11A and 11B are cross-sectional views showing configurations of memory cells according to Alteration 3. In FIG. 11A, the switch element is constituted by one stage of transistor TS1. The transistors TP1 and TS1 are connected to a bottom region 214. That is, the transistor TS1 constituting the switch element is connected between the bottom region 214 to which the bottom of the transistor TP1 constituting the program element is connected and the M2 interconnect 251 that is to be a bit line BL.

In FIG. 11B, the switch element is constituted by two stages of serially connected transistors TS1 and TS2. The tops of the transistors TP1 and TS1 are connected through a local interconnect 232, and the bottoms of the transistors TS1 and TS2 are connected to a bottom region 215. That is, the transistors TS1 and TS2 constituting the switch element are serially connected between the local interconnect 232 to which the top of the transistor TP1 constituting the program element is connected and the M2 interconnect 251 that is to be a bit line BL through the bottom region 215.

(Alteration 4)

In the layout structure according to the third embodiment described above, the first and second word lines WLP and WLR are placed on both sides of the row of the program element and the switch element in the X direction. Instead, one or both of the first and second word lines WLP and WLR may be placed between the program element and the switch element.

Figure 12A:
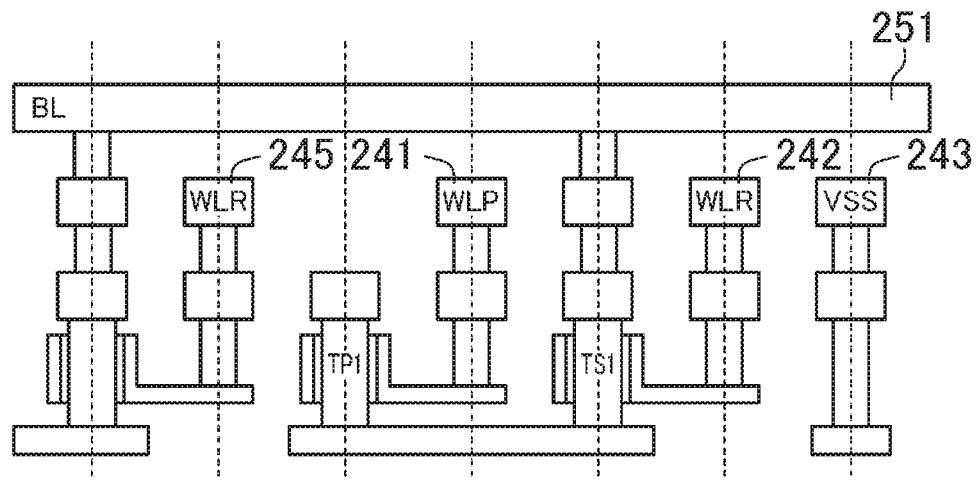
FIGS. 12A and 12B are cross-sectional views showing layout structures of memory cells according to an alteration of the third embodiment.
Figure 12B:
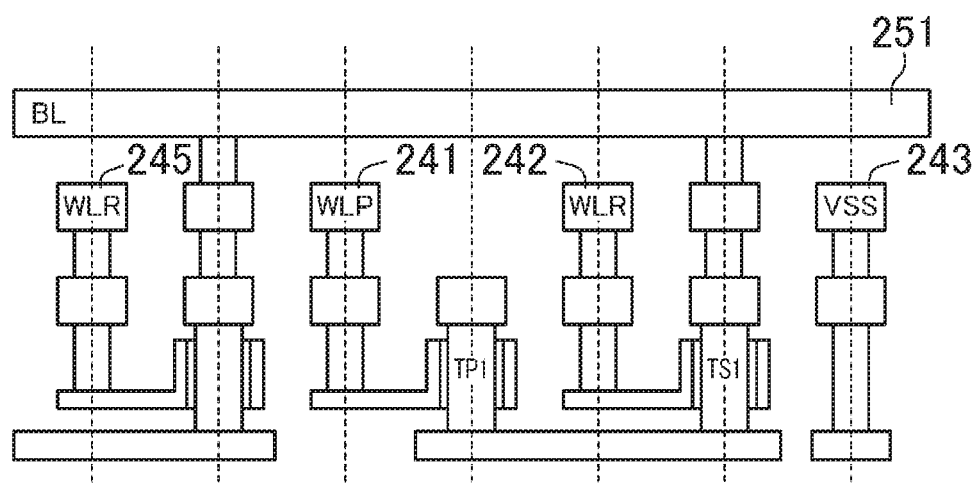
Figure 13:
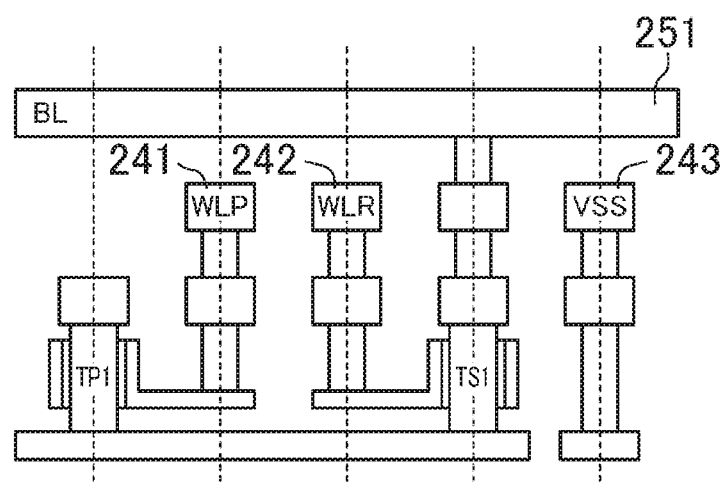
FIG. 13 is a cross-sectional view showing a layout structure of a memory cell according to an alteration of the third embodiment.

FIGS. 12A, 12B, and 13 are cross-sectional views showing configurations of memory cells according to Alteration 4. In these memory cells, switch elements are each constituted by one stage of transistor TS1. In FIG. 12A, the M1 interconnect 241 that is to be a first word line WLP is placed between the transistor TP1 that is the program element and the transistor TS1 that is the switch element. In FIG. 12B, the M1 interconnect 242 that is to be a second word line WLR is placed between the transistor TP1 that is the program element and the transistor TS1 that is the switch element. In FIG. 13, both the M1 interconnect 241 that is to be a first word line WLP and the M1 interconnect 242 that is to be a second word line WLR are placed between the transistor TP1 that is the program element and the transistor TS1 that is the switch element.

In the examples of FIGS. 12A and 12B, the M1 interconnect 241 that is to be a first word line WLP is avoided from being adjacent to the M1 interconnect 245 that is to be a second word line WLR for the adjacent memory cell on the left as viewed from the figure. This makes it possible to suppress crosstalk noise between the first word line WLP and the second word line WLR, and thus permits stable operation of the semiconductor memory device.

Other Embodiments (No. 1)

In the above embodiments, description was made taking a configuration of storing one piece of data in one memory cell as an example. The present disclosure is also applicable to a memory cell array in which the same data is stored in two or more memory cells.

Figure 14:
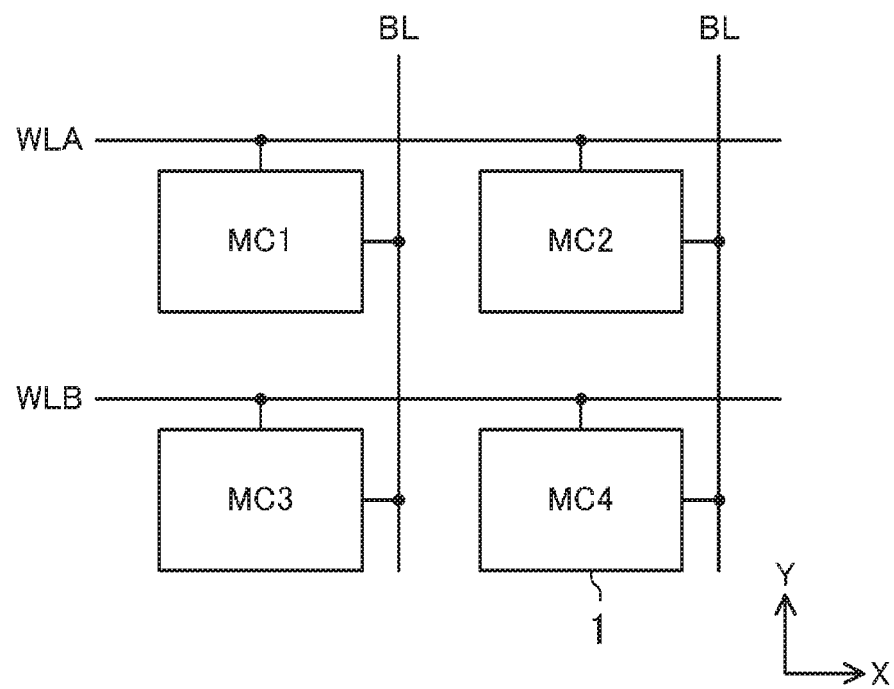
FIG. 14 is another block diagram of the memory cell array according to the first and second embodiments.

FIG. 14 is another block diagram of the memory cell array according to the first and second embodiments. In the configuration of FIG. 14, the same data is stored in two memory cells adjacent in the Y direction and read. For example, the same data is stored in the memory cells MC1 and MC3, and the same data is stored in the memory cells MC2 and MC4. A similar configuration is also applicable to the memory cell array according to the third embodiment.

Examples of specific write and read operations are as follows.

During the write, data is sequentially written into memory cells connected to a word line WLA (MC1 and MC2 in FIG. 14) and memory cells connected to a word line WLB (MC3 and MC4 in FIG. 14). The procedure of the write is similar to that described in the first embodiment. During the read, the voltage VRR is applied to the word lines WLA and WLB simultaneously. With this, even if the write (breakdown of the gate oxide film) has not been sufficiently done in one of the two memory cells (e.g., MC1 and MC3), a change occurs in the signal on the corresponding bit line BL by the other memory cell. Thus, the stored data can be read correctly.

Alternatively, during the write, the high voltage VPP may be applied to the word lines WLA and WLB simultaneously.

(No. 2)

While the planar shape of the VNWs is a circle in the layout structure examples described above, it is not limited to a circle. For example, the planar shape of the VNWs can be a rectangle or an oval. When the planar shape is an oval, for example, the area of the VNWs per unit area will be larger, allowing a larger amount of current to flow to the transistors and thus permitting speedup of the semiconductor memory device.

When the planar shape of the VNWs is a shape extending long in one direction like an oval, the direction of the extension is preferably uniform. Also, the positions of the ends are preferably aligned.

In memory cells, all VNWs are not necessarily required to have the same shape, but VNWs having different planar shapes may be present in a mixed manner. For example, circular VNWs and oval VNWs may be present in a mixed manner.

While one transistor is constituted by one VNW in the embodiments described above, one transistor may be constituted by a plurality of VNWs.

According to the present disclosure, a small-area layout structure can be implemented for a nonvolatile memory cell using VNW FETs. The present disclosure is therefore useful for downsizing of semiconductor chips, for example.

What is claimed is:

1. A semiconductor memory device comprising a nonvolatile memory cell, wherein
the memory cell includes
a program element of which a gate is connected to a word line, and
a switch element that is provided between the program element and a bit line and of which a gate is connected to the word line,
the program element and the switch element are each constituted by one or a plurality of vertical nanowire (VNW) FETs, and
the VNW FETs constituting the program element and the switch element are arranged in a line in a first direction.

2. The semiconductor memory device of claim 1, wherein the memory cell includes
a gate interconnect that extends in the first direction and is connected with gates of the VNW FETs constituting the program element and the switch element.

3. The semiconductor memory device of claim 2, wherein the word line extends in the first direction, and
the VNW FETs constituting the program element and the switch element, the gate interconnect, and the word line overlap one another as viewed from top.

4. The semiconductor memory device of claim 1, wherein the switch element includes a VNW FET of which a top electrode is connected with the bit line.

5. The semiconductor memory device of claim 1, wherein the switch element includes serially connected first, second, and third VNW FETs, and
top electrodes of the first and second VNW FETs are mutually connected and bottom electrodes of the second and third VNW FETs are mutually connected.

6. The semiconductor memory device of claim 2, wherein the gate interconnect has a first interconnect portion extending from a side of the program element opposite to the switch element in the first direction, and
the word line is connected to the first interconnect portion.

7. A semiconductor memory device comprising a nonvolatile memory cell, wherein the memory cell includes
- a program element of which a gate is connected to a first word line, and
- a switch element that is provided between the program element and a bit line and of which a gate is connected to a second word line, the program element and the switch element are each constituted by one or a plurality of vertical nanowire (VNW) FETs, and the VNW FETs constituting the program element and the switch element are arranged in a line in a first direction.

8. The semiconductor memory device of claim 7, wherein
the bit line extends in the first direction, and
the VNW FETs constituting the program element and the switch element and the bit line overlap each other as viewed from top.

9. The semiconductor memory device of claim 7, wherein
the switch element includes a VNW FET of which a top electrode is connected with the bit line.

10. The semiconductor memory device of claim 7, wherein
the switch element includes serially connected first, second, and third VNW FETs, and
top electrodes of the first and second VNW FETs are mutually connected and bottom electrodes of the second and third VNW FETs are mutually connected.

11. The semiconductor memory device of claim 7, wherein
the first and second word lines extend in a second direction perpendicular to the first direction.

12. The semiconductor memory device of claim 11, wherein
the first and second word lines do not overlap the VNW FETs constituting the program element and the switch element as viewed from top.

* * * * *